United States Patent [19]

Bird

[11] Patent Number: 5,132,160

[45] Date of Patent: Jul. 21, 1992

[54] COMPONENT CARRIER TAPE

[75] Inventor: Gerald C. Bird, Woodbury, Minn.

[73] Assignee: Minnesota Mining and Manufacturing Company, St. Paul, Minn.

[21] Appl. No.: 722,907

[22] Filed: Jun. 28, 1991

Related U.S. Application Data

[63] Continuation-in-part of Ser. No. 659,028, Feb. 21, 1991.

[51] Int. Cl.⁵ .................. B32B 3/12; B32B 5/14; B32B 5/18; B65D 73/02
[52] U.S. Cl. .................. 428/159; 206/329; 206/332; 206/523; 206/524.6; 428/131; 428/138; 428/170; 428/171; 428/218; 428/220; 428/288; 428/310.5; 428/311.5; 428/314.2; 428/219; 428/906
[58] Field of Search ............ 206/329, 332, 523, 524.6; 428/131, 138, 159, 171, 218, 220, 288, 310.5, 311.5, 314.2, 170, 219, 906

[56] References Cited

U.S. PATENT DOCUMENTS 4,103,058  7/1978  Humlicek .
4,298,120  11/1981 Kaneko .
4,406,367  9/1983  Bouwknegt .
4,657,137  4/1987  Johnson .
4,681,801  7/1987  Eian .
4,724,958  2/1988  Kaneko .
4,736,841  4/1988  Kaneko .
4,760,916  8/1988  Kaneko et al. .................. 206/329
5,007,534  4/1991  Tamaki et al. .................. 206/329

Primary Examiner—James C. Cannon
Attorney, Agent, or Firm—Gary L. Griswold; Walter N. Kirn; William L. Huebsch

[57] ABSTRACT

A carrier tape comprising a strip of flexible material having a series of spaced pockets and a predetermined thickness, the size of the pockets and the predetermined thickness being adapted to receive a component between the major surfaces of said strip. In a preferred embodiment the pockets have at least a substantially closed base portion which lies between the major surfaces of the strip. The strip of flexible material comprises a layer of nonwoven thermoplastic polymeric fiber adhered together and has in the range of 20 to 70 percent air filled open spaces between the fibers. The strip of flexible material may also be composed of a thermoplastic foam.

16 Claims, 4 Drawing Sheets

COMPONENT CARRIER TAPE

This is a continuation-in-part of application Ser. No. 07/659,028 filed Feb. 21, 1991.

TECHNICAL FIELD

The present invention relates to surface mount carrier tape of the type used to transport components from a component manufacturer to a different manufacturer or assembler that assembles the components into circuits.

BACKGROUND

Surface mount carrier tape is used to transport components (e.g., electrical components such as resistors, capacitors, or integrated circuits) from a component manufacturer to a different manufacturer or assembler that assembles the components into new products such as into circuit boards, typically by having automated assembly equipment sequentially remove components from the carrier tape and assemble them into the new products. Such carrier tape is a strip of material that has a series of identical pockets at predetermined uniformly spaced intervals along its length, which pockets are shaped to closely receive components the tape is adapted to transport (e.g., which pockets could, for example, have rectangular or generally "I" or "T" shapes in the plane of the strip). The strip normally also has through openings uniformly spaced along one side to receive a drive sprocket by which the strip can be driven and to provide indexing holes that can be used for accurately locating the pockets along the tape with respect to assembly equipment. Typically, the carrier tape is manufactured in a first manufacturing location, wound on a reel and transported to the supplier of the components it is intended to transport. The component supplier unwinds the carrier tape from the reel, fills the pockets along the carrier tape with components, adheres a removable cover strip along the carrier tape over the component filled pockets, winds the component filled carrier tape with the attached cover strip onto a reel, and sends it to the component assembler who feeds it from the reel into the assembly equipment which removes the components.

One common type of such carrier tape called embossed carrier tape, illustrated in U.S. Pat. No. 4,736,841, is typically formed from an initially flat polymeric heated thermoplastic strip using a tool to deform portions of the strip and form the pockets (e.g., male and female die sets, or a male or a female die over which the strip is vacuum formed). Although this carrier tape is termed embossed, it appears to have been made by thermoforming, e.g. vacuum thermoforming. The receiving concavities 17 as shown, for example in FIG. 2 of this reference, protrude from receiving sheet 15. This is a construction reflective of vacuum forming. This construction has the disadvantage that the protruding concavities, are subject to crushing as the sheet is tightly wound on a reel. In the embodiments shown in FIGS. 8 and 12 the receiving sheet 24 is formed with through-holes 25. Holes 25 penetrate entirely through sheet 24 and thus a bottom tape 26 is required to cover the bottom of the concavities in order to keep the electronic components from falling out.

A less expensive type of such carrier tape called flat punched carrier tape, illustrated in U.S. Pat. Nos. 4,298,120 and 4,657,137, is typically formed by die punching a series of openings of a desired shape for the pockets through a strip slit from a sheet of material having a thickness corresponding to the depth of the pockets to be formed. The die punched pockets are through-holes and have adhering a bottom strip along one side of the punched strip to form the bottoms for the pockets. U.S. Pat. Nos. 4,724,958, and 4,406,367 and 4,760,916 similarly show pockets which go through the carrier tape and have a bottom tape to form the bottoms for the pockets.

Most strips of material used in such carrier tapes are of paper. Fine dust particles generated during slitting and punching of paper are carried by the carrier tape and deposited on the automated assembly equipment and new products of the component assembler, which can cause product quality problems. Paper has many fillers which are very abrasive to die punch tools, resulting in accelerated wear of the die and poor quality punching. Also, because of problems with delamination of layers within such paper strips, the thickness of the paper strips used in such carrier tape has been limited to about 1 millimeter (0.04 inch), which limits the size of the components that can be packaged in the carrier strip.

Strips of material used in such carrier tapes have also been made of polymeric materials which produce no dust when slit or punched. Such polymeric materials are typically filled with fillers to reduce their cost and improve the bond between existing cover tapes and the surface of such carrier tapes, which fillers make them stiffer than is desired and abrasive to die punch tools, while still being more expensive than carrier tape made with strips of paper material.

Other materials have also been suggested for the strips of material used in such carrier tapes, such as metal foils and rubber (see U.S. Pat. No. 4,298,120) and laminated polymeric foams (see U.S. Pat. No. 4,657,137); however, none has a combination of properties that provides a commercially acceptable solution to the problems discussed above.

DISCLOSURE OF INVENTION

The present invention provides a carrier tape of the type described above comprising a strip of flexible material, a series of spaced openings through the strip extending between its top and bottom major surfaces, the size of the openings along its major surfaces and its thickness being adapted to receive a component between the major surfaces of the strip; which carrier tape is improved in that the strip of flexible material comprises a layer of nonwoven thermoplastic polymeric fibers (e.g., fibers of polypropylene and polyethylene, or polypropylene and a copolymer of polypropylene) adhered together at their crossover points, with the strip of flexible material having in the range of 20 to 70 percent (and preferably 45 to 50 percent) air filled open spaces between the fibers.

Generally, the strip of flexible material is formed by (1) forming a nonwoven mat having a predetermined weight per unit area of thermoplastic polymeric fibers; (2) heating and compressing the nonwoven mat to adhere the fibers together and form a flexible sheet having flat generally parallel top and bottom major surfaces, a predetermined thickness between its top and bottom surfaces that is less than the original thickness of the mat, and having in the range of 20 to 70 percent air filled open spaces between the fibers; (3) slitting the sheet to form at least one strip; and (4) punching the strip to form the series of spaced openings extending between its major surfaces.

Such a strip of flexible material, while being slightly more expensive than paper, is lower in cost than the other polymeric materials described above, is dust free, and needs no fillers that can stiffen the strip or cause accelerated wear of the punching equipment; although fillers such as desiccants, conductive agents, humidicants, or adhesion modifiers can be added as desired or needed for specific applications. Also, proper selection of polymer blends for use as the fibers (e.g. polypropylene and polyethylene or polypropylene and copolymers of polypropylene) allow conventional cover tapes to bond sufficiently well to the major surfaces of the strip of flexible material to meet industry standards for such bonding. The strip of flexible material is very flexible when made up to 1 millimeter (0.04 inch) thick, and can be made as thick as 2.5 millimeters (0.1 inch) without being too stiff to use so that carrier tape made from it can be used to package larger components than many of the prior art carrier tapes described above.

In one embodiment of the carrier tape according to the present invention the strip of flexible material consists only of the layer of blown microfibers that are of about 75 percent polypropylene and about 25 percent polyethylene which provides a strip of flexible material for carrier tape that punches easily and meets existing industry standards for adhesion to its surfaces by conventional bottom and cover tapes. Blown microfiber sheetings per se, are described for example in U.S. Pat. No. 4,681,801.

In another embodiment of the carrier tape according to the present invention the strip of flexible material comprises a layer of blown microfibers that are of about 75 percent polypropylene and about 25 percent polyethylene and a relatively much thinner reinforcing layer (e.g., of a polypropylene film, or a spunbonded polypropylene nonwoven) adhered to one or both surfaces of the layer of blown microfibers to both increase the breaking strength of the carrier tape which may be necessary for use of the carrier tape with some carrier tape machines, and provide a surface that conventional bottom and cover tapes may be securely adhered to.

In another embodiment of the carrier tape according to the present invention the strip of nonwoven flexible material of thermoplastic fibers is embossed to form pockets for placement of electronic components therein. The strip of nonwoven flexible material for this embodiment includes the thermoplastic polymeric fibers as above described (e.g. fibers of polypropylene and polyethylene, or polypropylene and a copolymer of polypropylene) adhered together at their crossover points, preferably with the strip of flexible material having in the range of 20 to 70 percent (and preferably 45 to 50 percent) air filled open spaces between the fibers. The strip of nonwoven flexible material may preferably be composed of one layer of blown microfibers that are of about 75 percent polypropylene and about 25 percent polyethylene. Alternatively this embossed embodiment may also be composed of other nonwoven, flexible material such as thermoplastic foam. Such foam may typically be composed of polyethylene, polypropylene, polystyrene or blends thereof. The thermoplastic foam should have enough air space therein so that all the resinous material pushed out of the pockets during embossing, fills the air spaces. This prevents distortion of the carrier tape. The foam may typically have a fraction air volume of between about 20 and 90 percent. The carrier tape in this embodiment is embossed in such a manner that the formed pockets have at least a substantially closed base surface at the bottom of the pocket, that is the pockets are not through-holes. Since the pockets have a base, a tape to cover the bottom of the pocket is not needed. Additionally the overall planarity of the carrier is not changed. That is, the overall thickness of the carrier tape remains essentially the same after embossing as it was before and none of the formed pockets protrude outwardly from either the tape or bottom surfaces of the carrier. Since the formed pockets do not protrude from the carrier, they are protected from crushing when the carrier tape is tightly wound around a reel. Another advantage of the embossed carrier embodiment of the invention is that steps, partitions, bevels and other structures can be formed into the pockets during embossing. Straight punching of the carrier to form openings does not permit formation of such structures within the punched openings. (Such structures help to secure electronic components within the pockets and protect delicate lead structures associated with electronic devices, especially if the component is oddly configured.)

BRIEF DESCRIPTION OF DRAWING

The present invention will be further described with reference to the accompanying drawing wherein like reference numerals refer to like parts in the several views, and wherein.

DETAILED DESCRIPTION

Figure 1:
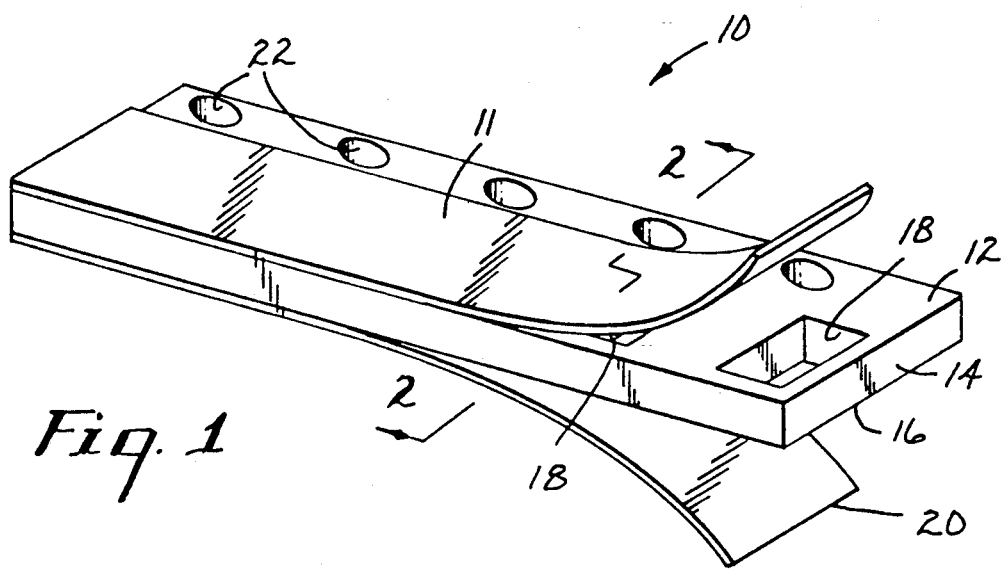
FIG. 1 is a perspective view of a short length of carrier tape according to the present invention having a cover tape adhered thereto, and having end portions separated to show details of the cover tape and of a strip of flexible material and a bottom tape included in the carrier tape.

Referring now to the drawing, there is shown a first embodiment of a carrier tape according to the present invention generally designated by the reference numeral 10 having a cover tape 11 adhered along a top surface 12 thereof.

Generally the carrier tape 10 comprises a strip of flexible material 14 having a top major surface that provides the top surface 12 of the carrier tape 10, an opposite bottom major surface 16, a series of spaced through rectangular openings 18 between its major surfaces 12 and 16, and a predetermined thickness between its major surfaces 12 and 16. The size and shape of the openings 18 along its major surfaces 12 and 16 and the predetermined thickness of the strip of flexible material 14 are adapted to receive a component (not shown) within each opening 18 between its major surfaces 12 and 16. Also, the carrier tape 10 includes a bottom tape or strip 20 adhered by a layer of a suitable adhesive (not shown) along the bottom surface 16 of the strip of flexible material 14 to form bottom walls across the openings 18 and, with the surfaces defining the openings 18, to define pockets in which the components will be retained. The strip of flexible material 14 also has a series of through, equally spaced, cylindrical openings 22 along one side to receive a drive sprocket by which the carrier tape 10 can be driven and to provide indexing openings that can be used for accurately locating the pockets along the carrier tape 10 with respect to assembly equipment in which the carrier tape 10 is intended to be used.

The general carrier tape structure described in the preceding paragraph is well known where the strip of flexible material is of paper or a filled plastic material. Unlike those prior art structures, however, in the carrier strip 10 according to the present invention the strip 14 of flexible material consists of a layer of nonwoven thermoplastic polymeric fibers which are adhered together at a substantial number of their crossover points and has in the range of 20 to 70 percent air filled open spaces between the fibers that provides the advantages described above. By "substantial number" we mean a number (typically over 50 percent but less than 100 percent of the crossover points) that will maintain the structural integrity of the strip 14 during its use in the carrier tape 10.

Figure 3:
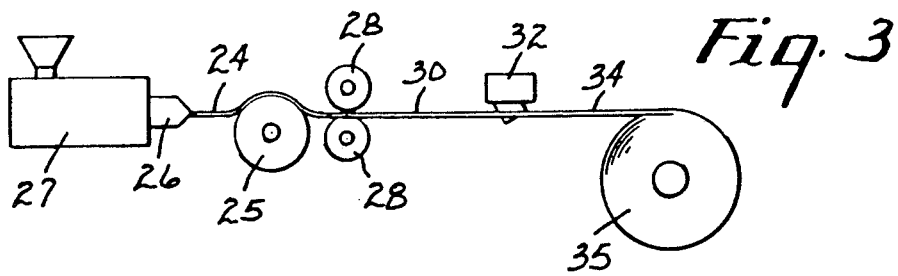
FIG. 3 is a schematic view illustrating a first portion of a method according to the present invention for making the strip of flexible material included in the carrier tape of FIGS. 1 and 2.

FIG. 3 schematically illustrates a first portion of a method according to the present invention for making the strip 14 of flexible material. As illustrated, a mat 24 of nonwoven blown microfibers of a polymeric material is formed on the periphery of a cylindrical collector 25 in a known manner by extruding the microfibers from a die 26 fed by an extruder 27, however, a similar mat of nonwoven thermoplastic polymeric fibers could be formed by other known methods such as by the use of a Rando webber, or carding, or wet laid equipment. The mat 24 of nonwoven fibers thus formed is heated and compressed in a nip between a pair of heated (e.g., at 200 degrees Fahrenheit) cylindrical rollers 28 to form a flexible sheet 30 having flat top and bottom surfaces, having a predetermined thickness between its top and bottom surfaces that is less than the thickness of the mat 24 and is determined by the spacing at the nip between the rollers 28, and having in the range of 20 to 70 percent air filled open spaces between the fibers. The flexible sheet 30 is then slit by a conventional slitting equipment 32 to form at least one and preferably a plurality of strips (only one strip 34 being shown), which strip 34 can, as illustrated, be helically rolled around the hub of a reel to form a supply roll 35 of the strip 34.

Figure 2:
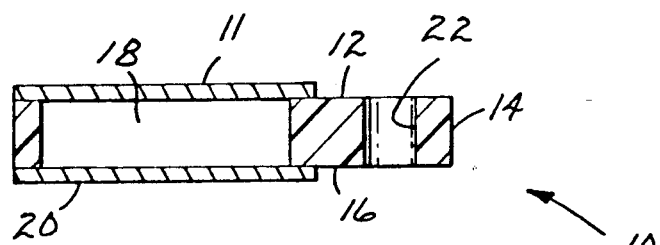
FIG. 2 is an enlarged cross sectional view taken approximately along line 2—2 of FIG. 1.
Figure 4:
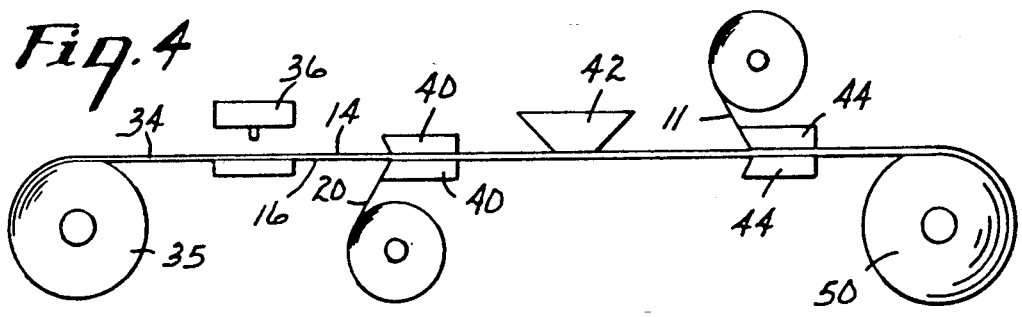
FIG. 4 is a schematic view illustrating a second portion of the method according to the present invention for making the strip of flexible material included in the carrier tape illustrated in FIGS. 1 and 2, for applying the bottom tape to the strip of flexible material, and for filling the carrier tape with components and applying the cover tape thereto.

A second portion of the method according to the present invention for making the strip 14 of flexible material is illustrated in FIG. 4. The strip 34 from the supply roll 35 is unwound and punched using conventional punching equipment 36 to form the strip of flexible material 14 incorporated in the carrier tape 10 with its series of spaced rectangular openings 18 and cylindrical openings 22 that are illustrated in FIGS. 1 and 2. The bottom strip 20 is then applied to the bottom surface 16 of the strip of flexible material 14 as it passes between a pair of heated platens 40 to provide the bottom walls across the openings 18 and, with the surfaces defining the openings 18, defining pockets along the carrier tape 10. The pockets along the carrier tape 10 are sequentially filled with components as the carrier tape 10 passes beneath a component filling device 42, after which the cover tape 11 is applied between a pair of heated platens 44 to the top surface 12 of the strip of flexible material 14, and the component filled and covered carrier tape 10 is wound on a reel 50 ready to be shipped to an assembler who will assemble the components into his products using automated assembling equipment.

The first portion of the method illustrated in FIG. 3 can be performed by one manufacturer who manufacturers the strip 34, and the second portion of the method illustrated in FIG. 4 can be performed by the supplier of the components. Alternatively, The first portion of the method illustrated in FIG. 3 together with the punching and the application of the bottom strip 20 illustrated in FIG. 4 can be performed by the manufacturer who manufacturers the strip 34, whereupon only the filling of the pockets with components and the application of the cover tape 11 will be done by the supplier of the components.

Using the method described above, virtually any type of thermoplastic polymeric material which can be extruded can be used to make the fibers from which the strip of flexible material 14 is made. Of the thermoplastic polymeric materials that have been tested, polypropylene and polyesters or their copolymer blends provide the best strips of flexible material 14, with the best embodiment being of polypropylene, having about 40 to 50 percent air filled open spaces between the fibers, and having an average weight of about 400 grams per square meter at a thickness between its major surfaces of about 0.09 centimeter (0.035 inches).

The maximum thickness of the strips of flexible material 14 that can be made are somewhat limited by the ability to adhere the fibers together along the central portions of the nonwoven strips of flexible material 14 (i.e., about half way between their major surfaces 12 and 16) by the transfer of heat through the fibers from the heated rollers 28. Using fibers coextruded of polypropylene and a low melting temperature copolyester should result in adhering together of fibers in that central portion with less heat input due to the ability of the copolyester to melt and adhere the fibers together with relatively low heat input, thus allowing even thicker strips of flexible nonwoven material 14 to be manufactured using the same heated rolls 28 and heat input to the fibers.

Figure 5:
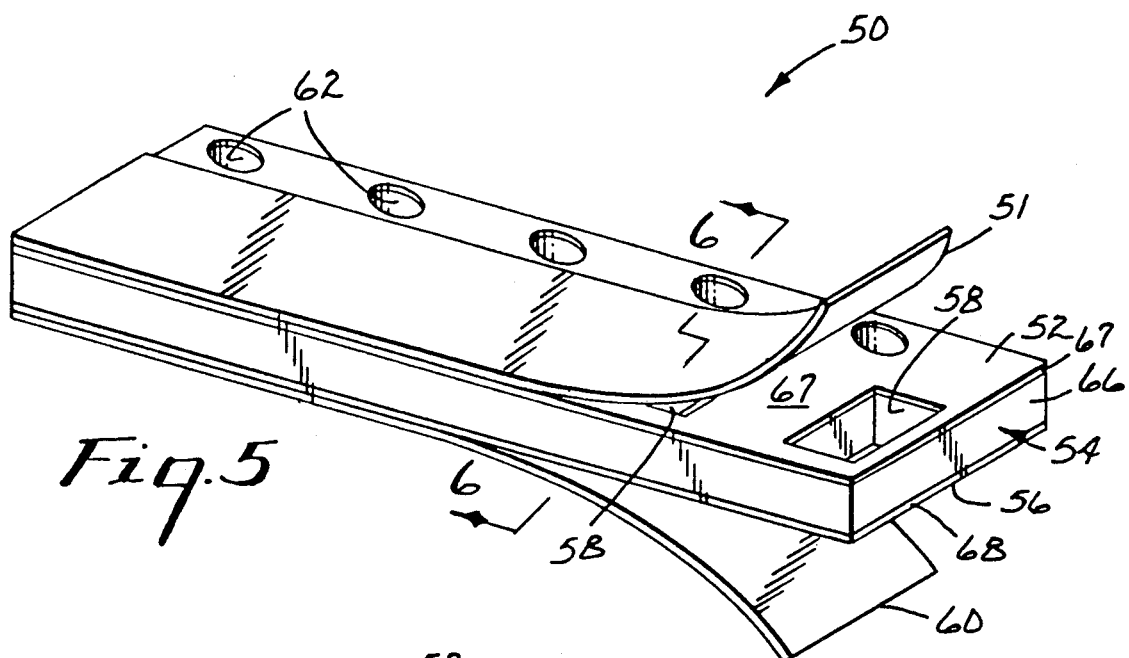
FIG. 5 is a perspective view of a second embodiment of a short length of carrier tape according to the present invention having a cover tape adhered thereto, and having end portions separated to show details of the cover tape and of a strip of flexible material and a bottom tape included in the carrier tape.
Figure 6:
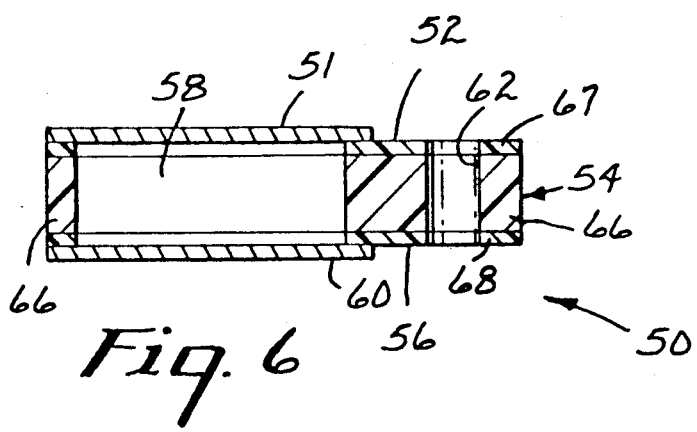
FIG. 6 is an enlarged cross sectional view taken approximately along line 6—6 of FIG. 5.

FIGS. 5 and 6 of the drawing illustrate a second embodiment of a carrier tape according to the present invention generally designated by the reference numeral 50 having a cover tape 51 adhered along a top surface 52 thereof.

Generally, like the carrier tape 10, the carrier tape 50 comprises a strip of flexible material 54 having a top major surface that provides the top surface 52 of the carrier tape 50, an opposite bottom major surface 56, a series of spaced through rectangular openings 58 between its major surfaces 52 and 56, and a predetermined thickness between its major surfaces 52 and 56. The size and shape of the openings 58 along its major surfaces 52 and 56 and the predetermined thickness of the strip of flexible material 54 are adapted to receive a component (not shown) within each opening 58 between its major surfaces 52 and 56. Also, the carrier tape 50 includes a bottom tape or strip 60 adhered by a layer of a suitable adhesive (not shown) along the bottom-'surface 56 of the strip of flexible material 54 to form bottom walls across the openings 58 and, with the surfaces defining the openings 58, to define pockets in which the components will be retained. The strip of flexible material 54 also has a series of through, equally spaced, cylindrical openings 62 along one side to receive a drive sprocket by which the carrier tape 50 can be driven and to provide indexing openings that can be used for accurately locating the pockets along the carrier tape 50 with respect to assembly equipment in which the carrier tape 50 is intended to be used.

Unlike the carrier tape 10, in the carrier strip 50 the strip 54 of flexible material includes both a layer 66 of nonwoven thermoplastic polymeric fibers adhered together at a substantial number of their crossover points and having in the range of 20 to 70 percent air filled open spaces between the fibers that provides the advantages described above, and two relatively much thinner reinforcing layers 67 and 68 (e.g., of a polypropylene film, or a spunbonded polypropylene nonwoven) adhered to both surfaces of the layer 66 of fibers to both increase the breaking strength of the carrier tape 50 which may be necessary for use of the carrier tape 50 with some carrier tape machines; and provide the major surfaces 52 and 56 for the strip 54 of flexible material to which conventional bottom and cover tapes 60 and 51 may be securely adhered.

Figure 7:
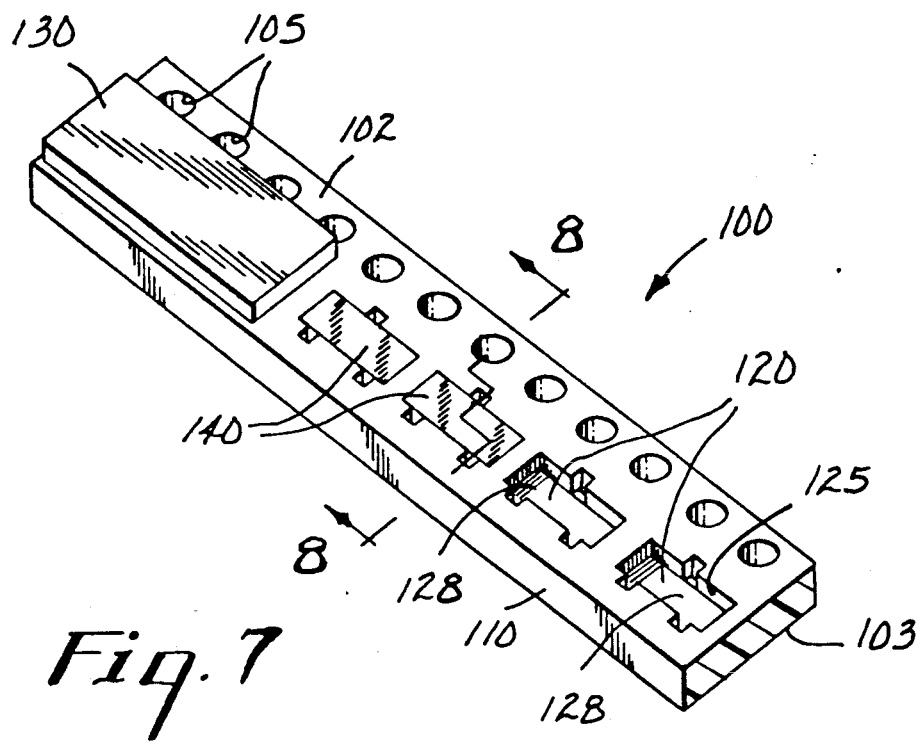
FIG. 7 is a perspective view of an embossed carrier tape which is a third embodiment of the invention.
Figure 8:
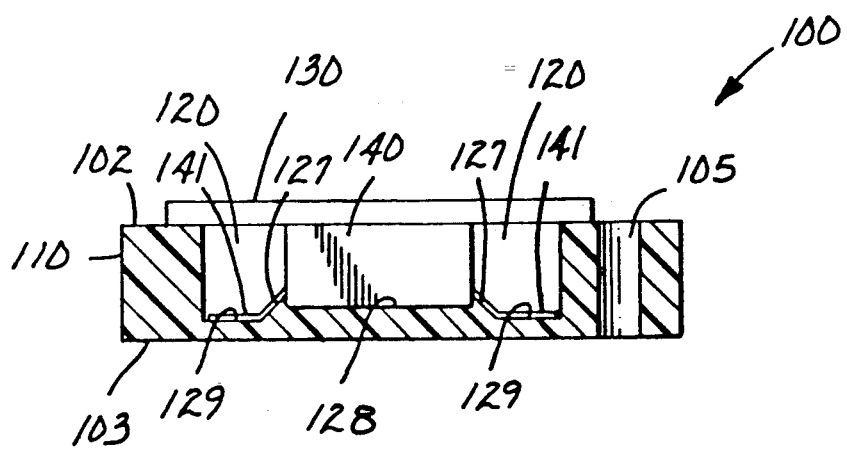
FIG. 8 is an enlarged cross sectional view taken approximately along lines 8—8 of FIG. 7.
Figure 9:
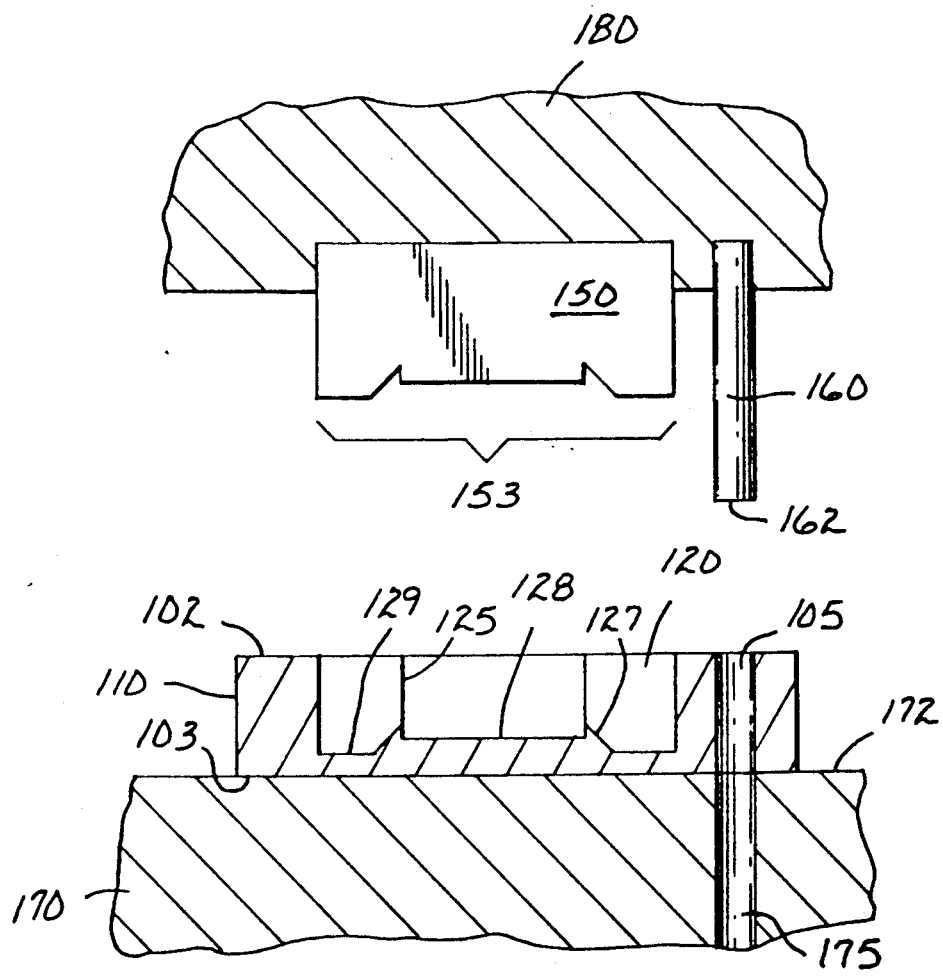
FIG. 9 is an enlarged view showing the embossing die forming pockets in the carrier tape.

FIG. 7 illustrates a third embodiment of the present invention. The carrier tape 100 shown in FIG. 7 comprises a flexible core strip 110 which is a strip of flexible nonwoven material having a top surface 102 and a bottom surface 103 and a series of pockets 120 embossed into strip 110. Carrier tape 100 also has a top cover tape 130 to cover pockets 120 and also has sprocket holes 105 along one side to receive a drive sprocket by which carrier tape 100 may be driven. Core strip 110 has an average overall thickness typically between about 0.5 mm (0.020 inches) and 2.5 mm (0.100 inches). Core 110 is formed of a thermoplastic material that may be composed of nonwoven thermoplastic fiber having any of the compositions above described with reference to flexible material 14 (FIGS. 1 and 2) and flexible material 66 (FIG. 5). For example core strip 110 may be composed of nonwoven thermoplastic polymeric fibers having in the range of 20 to 70 percent air filled open spaces between the fibers. Such fibers as described in the foregoing may typically be blown microfibers of polypropylene and polyethylene. Preferably the fibers are blown microfibers of about 75 percent polypropylene and about 25 percent polyethylene and has an average weight of about 400 grams per square meter. Core 110 may be composed of other thermoplastic fibers for example polyesters, or copolymers of polypropylene or polyester fibers. Alternatively core 110 may be composed of nonwoven thermoplastic foam material. Suitable thermoplastic foam for example may include polyethylene, polypropylene, polystyrene or combinations thereof. The thermoplastic foam should have enough air space therein to prevent distortion of core 110 during embossing. That is, there should be enough air space in the foam so that all of the resinous material pushed out of pockets 120 during embossing fills the air space. The thermoplastic foam may typically have a density between about 0.05 gram per cubic centimeter, and 0.75 grams per cubic centimeter and a fraction air volume between about 20 and 90 percent. Pockets 120 are formed into core 110 by employing conventional embossing or hot stamping methods. Such embossing involves passing an embossing die 150 typically in the form of a hot stamp die as shown in FIG. 9 over core strip 110 and in pressure contact therewith to compress portions of core 110 thereby forming pockets 120. The embossing die surface 153 has the shape of pockets 120 so that pockets 120 are impregnated into core strip 110 as the embossing die is pressed into core 110. Pockets 120 are formed by embossing to provide side walls 125 and also preferably a closed or at least substantially closed bottom or base surface 128. Thus formation of a base surface 128 eliminates the need for a bottom strip or tape to cover the bottom of the pocket. During embossing, the flexible, nonwoven material underlying base surface 128 has been compressed to a higher density than the average density of the remaining nonwoven material in core strip 110. Optionally pockets 120 may be embossed so as to provide other structures such as a step, 127, indented bottom portion 129 or partitions or bevels within the pocket. Such structures cannot be formed by straight hole punching techniques. Optional structures 127 and 129 can assist in properly securing oddly shaped electronic component portions such as component legs 141 within pockets 120 as shown in FIG. 8. The embossed pockets 120 can be formed to close tolerances and also permits storage of many types of components in addition to electronic connectors. For example, pockets 120 may be configured to store components as connectors, intraocular lenses and small pieces of hardware. Pockets 120 are formed such that base 128 is at least substantially closed and typically is entirely closed. Base 128 preferably lies in a plane between the top surface 102 and bottom surface 103 of carrier strip 100. That is, base 128 preferably does not protrude outwardly from bottom surface 103 but rather lies between top surface 102 and bottom surface 103 as illustrated in FIGS. 8 and 9. Side walls 125 project up from base 128 and also lie between top surface 102 and 103 that is, within the thickness of core strip 110.

The embossing of core 110 is preferably carried out in the following manner.

The embossing of the thermoplastic strip 110 to form pockets 120 can be carried out using a conventional die stamp 150 as shown in FIG. 9 attached to plunger 180 or alternatively an embossing roller. Die 150 (or embossing roller) has the pattern 153 of pockets 120 cut into its surface. As shown in FIG. 9 the thermoplastic strip 110 is placed upon surface 172 of die plate 170. Typically strip 110 has an overall thickness between about 0.5 mm to 2.5 mm. In the embossing operation embossing die 150 will be pushed into contact with strip 110. By applying enough pressure to plunger 180 die 150 impregnates strip 110 and forms pockets 120 therein. A sprocket die 160 (FIG. 9) typically having a cylindrical shape which is also attached to plunger 180 forms sprocket holes 105 during the embossing operation. Preferably die 150 is preheated to a temperature high enough that the thermoplastic strip 110 will soften upon die contact, thereby making it easier to impart fine detail into the embossed pockets 120. Thus die 150 may be heated to a temperature between the softening and melting points of strip 110. Alternatively the thermoplastic strip 110 can be preheated immediately prior to contact of die 150. Such preheating can be accomplished in a variety of methods for example by passing hot air over the strip 110 or by using infrared heating devices such as eletrical resistance heaters. The travel distance of plunger 180 is preset so that die 150 does not press into or deform the unembossed regions of the thermoplastic strip 110. Typically the depth of embossed pocket 120 is such that the depth of material left underneath base 128 of pocket 120 is at least about 0.013 cm (0.005 inches). The die 150 is typically held for a dwell time of several seconds in pressure contact with strip 110. The dwell time is typically between about 1 to 10 sec. The dwell time can be adjusted depending on the material used for strip 110 and the amount of fine detail desired within pockets 120. After thermoplastic strip 110 has been embossed to form pockets 120, the strip normally cools quickly enough in ambient air without the need for outside cooling. However, it is possible to expose the embossed strip 110 to additional cooling such as by blowing cold air on the strip to hasten the cooling process and facilitate retention of finer detailed patterns within pockets 120. The following examples illustrate the embossing of strip 110.

EXAMPLE 1

A strip of nonwoven polypropylene fibers having an air volume of 50% and thickness of about 0.10 cm (0.040 inches) and a width of 0.80 cm (0.31 inches) was placed on surface 172 of die plate 170. Die stamp 150 shown in FIG. 9 was formed of hard tool carbon steel. Die stamp 150 was preheated to a temperature of about 150° C. by heating with hot air. (Alternatively die 150 can be fitted with internal electrical coils to maintain the die at the desired temperature.) The die 150 was formed to the desired shape to form pockets 120 having the configuration shown in FIG. 9. By applying a downward pressure to plunger 180 of about 2060 newton/cm$^2$ (as measured by the force applied to the embossed contact area) the heated die 150 was pressed into strip 110 and held in pressure contact with strip 110 for a dwell time of about 10 seconds. When the die was released a pocket 120 was formed having the features shown in FIG. 9 including step feature 127. The formed pocket 120 had a width of about 0.22 cm (0.087 inches) a length of about 0.33 cm (0.130 inches) and a depth of about 0.08 cm. The embossed strip 110 was left to cool in ambient air. The planarity of strip 110 had not become distorted and the overall thickness of strip 110 was the same before and after embossing.

EXAMPLE 2

A strip of nonwoven polyethylene foam having an air volume of approximately 95 percent, a width of 4.5 cm (1.77 inches) and a thickness of 0.80 cm (0.40 inches) was placed on surface 172 of die plate 170. Die stamp 150 shown in FIG. 9 was formed of hard tool carbon steel. Die stamp 150 was preheated to a temperature of about 220° C. by heating with hot air. The heated die 150 as described in Example one was pressed into strip 110 with a pressure of about 1.4 newtons/cm$^2$ (as measured by the embossed contact area) for a dwell time of about 3 seconds. When the die was released a pocket 120 was formed having the features shown in FIG. 9 including step feature 127. The formed pocket 120 had a width of about 3.5 cm (1.38 inches), a length of about 1.0 cm (0.39 inches) and a depth of about 0.70 cm. The embossed strip 110 was left to cool in ambient air. The planarity of strip 110 had not become distorted and the overall thickness of strip 110 was the same before and after embossing.

The present invention has now been described with reference to three embodiments thereof. It will be apparent to those skilled in the art that many changes can be made in the embodiments described without departing from the scope of the present invention. Thus the scope of the present invention should not be limited to the structures described in this application, but only by structures described by the language of the claims and the equivalents of those structures.

I claim:

1. A carrier tape comprising a strip of flexible, nonwoven web material having top and bottom major surfaces, said strip having a series of spaced pockets formed within the strip between said major surfaces to form a portion of a carrier tape in which components are received in the pockets between the major surfaces of said strips, said spaced pockets having a base surface at one end thereof and an opening through one of the major surfaces and opposite said base surface, and side walls projecting up from the base surface within the thickness of said web material, said base surface integrally formed within said strip of flexible material, and said base lying between said top and bottom major surfaces of the strip.

2. A carrier tape as in claim 1 wherein said strip of flexible, nonwoven material comprises a layer of nonwoven thermoplastic polymeric fibers, said fibers being adhered together at a substantial number of the fiber crossover points and said layer of nonwoven thermoplastic fibers having in the range of 20 to 70 percent air filled open spaces between the fibers.

3. A carrier tape as in claim 2 wherein said fibers are blown microfibers of polypropylene and polyethylene.

4. A carrier tape as in claim 2 wherein said fibers are blown microfibers of about 75 percent polypropylene and about 25 percent polyethylene.

5. A carrier tape as in claim 2 wherein said fibers are blown microfibers of about 75 percent polypropylene and about 25 percent polyethylene, and said strip of flexible material consists only of said layer of nonwoven thermoplastic polymeric fibers and has an average weight of about 400 grams per square meter and an average thickness between said major surfaces of about 0.9 millimeter (0.035 inch).

6. A carrier tape as in claim 2 wherein said layer of thermoplastic polymeric fibers has in the range of 45 to 50 percent air filled open spaces between the fibers.

7. A carrier tape as in claim 1 wherein said strip of flexible material is in the range of about 0.2 to 2.5 millimeter thick between said major surfaces.

8. A carrier tape as in claim 1 wherein said series of pockets have at least one step formed integrally within said pockets.

9. A carrier tape as in claim 1 wherein said series of pockets are formed by compressing portions of the strip of flexible nonwoven material.

10. A carrier tape as in claim 9 wherein the flexible nonwoven material underlying the base surface of said pockets has been compressed to a higher density than the average density of the remaining nonwoven material in said carrier tape.

11. A carrier tape as in claim 1 wherein said strip of flexible nonwoven material comprises a thermoplastic foam material.

12. A carrier tape as in claim 11 wherein the thermoplastic foam comprises an air volume of between about 20 to 90 percent.

13. A carrier tape as in claim 11 wherein the thermoplastic foam is selected from the group consisting of polyethylene, polypropylene and polystyrene and blends thereof.

14. A carrier tape as in claim 11 wherein said strip has an average thickness between said major surfaces of between about 0.5 millimeters (0.02 inches) and 15 millimeters (0.60) inches.

15. A carrier tape as in claim 11 wherein said series of pockets has at least one step formed integrally within said pockets.

16. A carrier tape as in claim 1 wherein the flexible nonwoven material underlying the base surface of said pockets has a higher density than the average density of the remaining nonwoven material in said carrier tape.

* * * * *